(12) United States Patent
Chan et al.

(10) Patent No.: US 6,236,107 B1
(45) Date of Patent: May 22, 2001

(54) ENCAPSULATE RESIN LOC PACKAGE AND METHOD OF FABRICATION

(75) Inventors: Min Yu Chan; Siu Waf Low; Jing Sua Goh, all of Singapore (SG)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 08/474,421

(22) Filed: Jun. 7, 1995

Related U.S. Application Data

(62) Division of application No. 08/235,849, filed on Apr. 29, 1994.

(51) Int. Cl.[7] .................................................. H01L 39/00
(52) U.S. Cl. .......................... 257/666; 257/691; 257/676
(58) Field of Search ...................................... 257/666, 691

(56) References Cited

U.S. PATENT DOCUMENTS

| | | | |
|---|---|---|---|
| 3,629,672 | * | 12/1971 | Van de Water . |
| 3,839,660 | * | 10/1974 | Stryker . |
| 4,862,245 | * | 8/1989 | Pashby et al. . |
| 4,916,519 | * | 4/1990 | Ward ..................................... 257/666 |
| 5,227,661 | * | 7/1993 | Heinen ................................... 257/666 |
| 5,304,842 | * | 4/1994 | Farnworth et al. . |
| 5,359,224 | * | 10/1994 | Heinen et al. ......................... 257/691 |
| 5,442,233 | * | 8/1995 | Anjoh et al. .......................... 257/691 |

* cited by examiner

*Primary Examiner*—Mahshid Saadat
*Assistant Examiner*—Lourdes Cruz
(74) *Attorney, Agent, or Firm*—W. Daniel Swayze, Jr.; Wade James Brady III; Frederick J. Telecky, Jr.

(57) ABSTRACT

A method and apparatus for fabricating small form factor semiconductor chips having high temperature resistance, good humidity and chemical resistance and good dielectric properties. The semiconductor chip includes a lead frame (10) attached to an integrated circuit die (30) by a lead-on-chip (LOC) method. Wire bonds (40) are employed to connect the integrated circuit die (30) to conduction leads (75) on the lead frame (10). After the wire bonding process, the surface of the wire bonded integrated circuit is encapsulated with a layer of resin (50) using either a direct dispensing method or by a screen printing method. The encapsulated integrated circuit may then be cured and functionally tested.

12 Claims, 5 Drawing Sheets

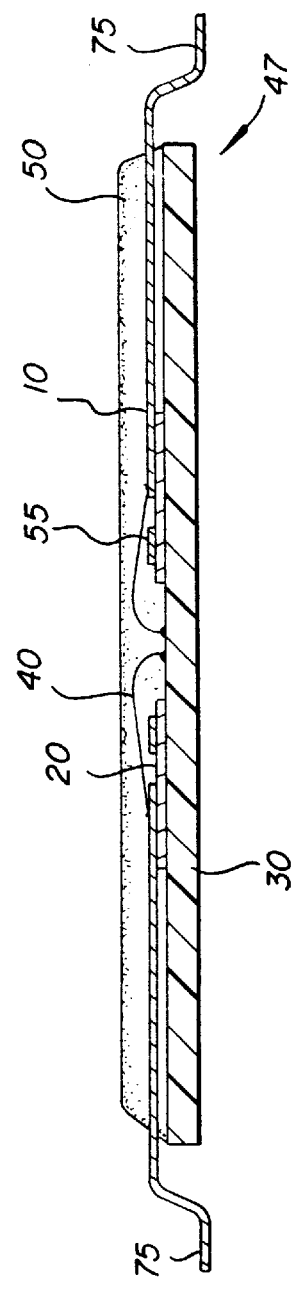

US 6,236,107 B1

ENCAPSULATE RESIN LOC PACKAGE AND METHOD OF FABRICATION

This is a Divisional of application Ser. No. 08/235,849, filed Apr. 29, 1994.

TECHNICAL FIELD OF THE INVENTION

This invention relates in general to integrated circuit devices and more particularly to an assembly process and a structure for packaging an integrated circuit.

BACKGROUND OF THE INVENTION

Following the fabrication of a semiconductor integrated circuit, the completed device is be attached to a lead frame so as to provide connections to external components through, for example, a printed circuit board (PCB). Moreover, the integrated circuit device is encapsulated in order to protect it from environmental factors as well as to standardize its physical dimensions for the purpose of interfacing with other devices at the component level.

As is well known in the art, increasing circuit complexities, device miniaturization and additional circuit board space limitations have called for smaller and smaller package volumes. It is, therefore, easily understood why it is desirable for the package volume to be as close in size to the encapsulated circuit die as possible.

One of the major problems resulting from conventional packaging processes is the occurrence of voids in the encapsulating material itself. Voids can refer both to holes in the hardened plastic package or to an incomplete package. These voids are believed to occur as a result of a lack of fluidization of the encapsulating material, or by a chase or runner jamming mechanism which may occur when the encapsulating material starts to solidify before it reaches the mold cavity. As additional encapsulating material is forced down the runners, the partially solidified material enters the cavity but fails to completely fill it in. This results in what is sometimes referred to in the industry as the "incomplete fill" problem. As is known in the art, the incomplete fill problem is exacerbated as package thickness is decreased.

Another disadvantage of conventional packaging technologies occurs when constructing multi-chip modules (MCMs). In this case there is often an inability to test each individual component for electrical function prior to the time that the component is encapsulated in the MCM.

SUMMARY OF THE INVENTION

From the foregoing, it may be appreciated that a need has arisen for a semiconductor packaging assembly and method whereby a very thin form factor can be achieved. A need has also arisen for a method and assembly which eliminate the above-described incomplete fill problem. Additionally, a need has arisen for a packaging method providing the ability to test circuit functionality prior to incorporation into a multichip module (MCM) so as to eliminate the possibility of including a faulty chip in an MCM.

In accordance with the present invention, a method and apparatus is provided for fabricating small form factor semiconductor chips having high temperature resistance, good humidity and chemical resistance and good dielectric properties. The semiconductor chip of the present invention includes a lead frame attached to an integrated circuit die by a lead-on-chip (LOC) method. Wire bonds are employed to connect the integrated circuit to conduction leads on the lead frame. After the wire bonding process, the surface of the wire bonded integrated circuit is encapsulated with a layer of resin using either a direct dispensing method or by a screen printing method. The encapsulated integrated circuit is then cured and functionally tested.

The present invention provides various technical advantages over conventional semiconductor chips. For example, one technical advantage is the ability to encapsulate integrated circuits within very thin packages. Another technical advantage is the chip's ability to resist high temperatures, humid environments and contact with various chemicals. Other technical advantages will be readily apparent to one skilled in the art from the following figures, descriptions and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIG. 3 is an isometric view of the resin LOC package according to one embodiment of the invention;

FIG. 4 is a side view of the resin LOC package according to one embodiment of the invention;

DETAILED DESCRIPTION OF THE INVENTION

Figure 1:
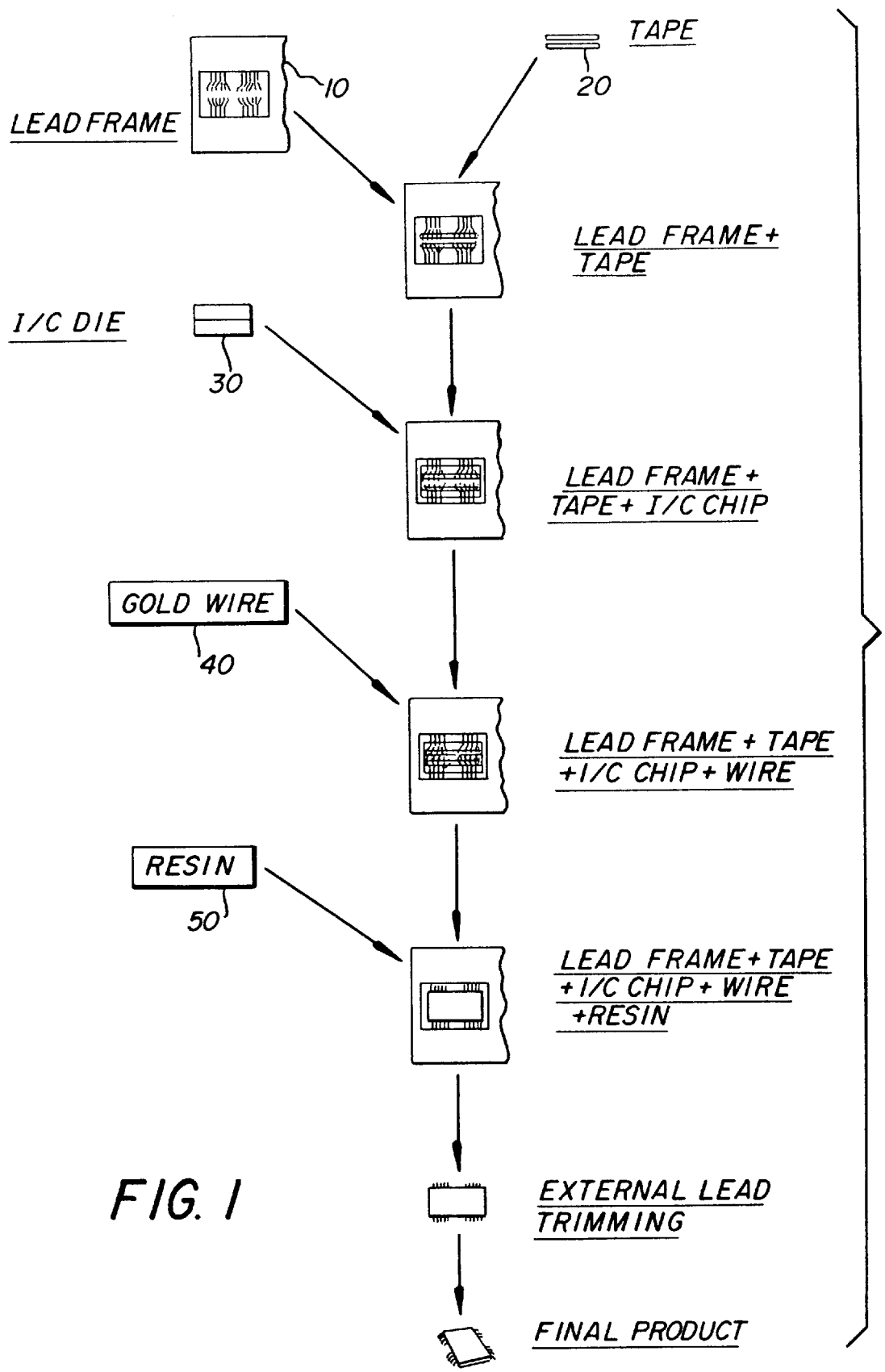
FIG. 1 illustrates an overview of the encapsulate resin LOC process according to one embodiment of the invention.

FIG. 1 is a diagrammatic illustration of the manufacturing processing steps for constructing the resin LOC package in accordance with one embodiment of this invention. For purposes of this discussion, a broad overview of this process will be given in connection with FIG. 1. A discussion of the detail of each broad step and the material involved will follow in conjunction with subsequent figures. In one embodiment of this invention, multiple integrated circuits are packaged concurrently and later separated or singulated. It will be understood by one skilled in the art that the below-described process could similarly be performed on individual integrated circuits without deviating from the invention herein.

Initially, lead frame 10 is combined with adhesive tape 20. Adhesive tape 20 may be a double-sided tape which is placed in contact with the bottom of lead frame 10 on one side and in contact with the integrated circuit die 30 on the other side. The integrated circuit die 30 may thus be fastened to the lead frame 10 using a lead-on-chip (LOC) mounting method.

The combination of the lead frame 10, adhesive tape 20 and integrated circuit die 30 is next processed so as to form wire bonds 40 connecting the integrated circuit to conduction leads on the lead frame 10. After the wire bonding step is completed, the surface of the wire bonded lead frame and integrated circuit combination is encapsulated with a resin compound 50. Resin compound 50 may be any resin known in the art which provides environmental and mechanical protection for the chip. The encapsulated device may then be cured in an oven at a specified temperature profile. Each of the cured chips are then singulated and the leads are trimmed and formed. Electrical testing may occur after encapsulation subsequent to singulation.

Figure 2:
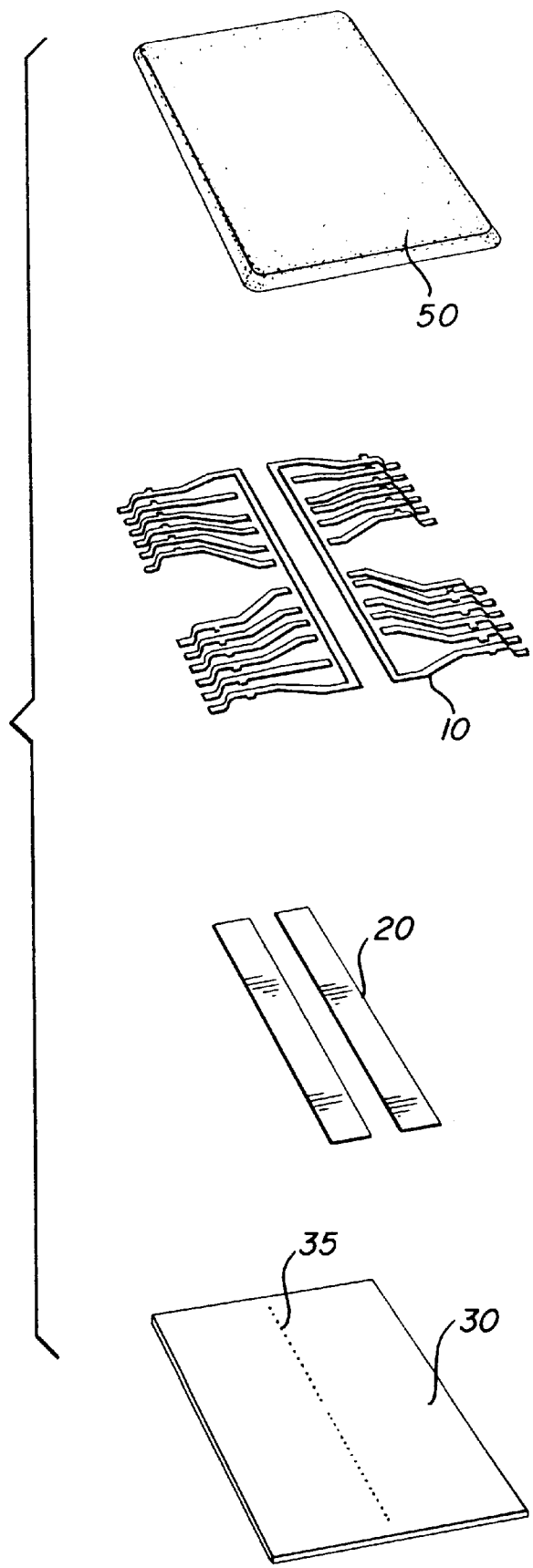
FIG. 2 is an exploded view of the resin LOC package according to one embodiment of the invention.

FIG. 2 illustrates an exploded view of the structure of the encapsulate resin LOC package. It can be seen that integrated circuit die 30 may be designed such that some or all of the contact pads 35 lie in linear fashion in the center of integrated circuit die 30. Adhesive tape 20 may then consist of two thin rectangular strips each placed on alternate sides of contact pads 35. As will be apparent to one of ordinary skill in the art, contact pads 35 could, for example, alternately be placed on the perimeter of integrated circuit die 30. In this case adhesive tape 20 could be arranged in any manner so long as it does not interfere with the access to contact pads 35. In the event that contact pads 35 lie in the center of integrated circuit die 30, as described above, lead frame 10 may be designed so as to consist of two separate groupings of leads which are connected during the packaging process but disengaged at the time of singulation.

FIG. 3 is an isometric view of the resin LOC package according to one embodiment of the invention. In this embodiment, contact pads 35 run linearly down the center of integrated circuit die 30. Wire bonds 40 attach contact pads 35 to one or more selected leads 75 located on lead frame 10. The wire bonds 40 may be any thin, durable, conductive metal, such as gold wires having a diameter of 1.2 Mil, for example. Lead frame 10 may include an elongated strip 55 of metal connecting one or more leads 75. Such a strip 55 may be employed as a ground or supply voltage conductor which is connected, via wire bond 40, to the proper contact pad(s) 35 located on integrated circuit die 30.

Adhesive tape 20 is located directly on the surface of integrated circuit die 30 on one side. The other side of adhesive tape 20 may be attached to lead frame 10 in a variety of ways. For example, adhesive tape 20 may contact lead frame 10 along the length of elongated strip 55 as shown in FIG. 3. Adhesive tape 20 may further contact the interior end of leads 75 as also illustrated in FIG. 3. The adhesive tape 20 is attached on both sides during the LOC mounting process at elevated temperature and pressure.

The metal lead frame 10 may be Alloy 42 pre-plated with silver although a variety of other configurations are possible as is known in the art. The resin 50 which is applied subsequent to the wire bonding step may be comprised of any of a variety of materials such as epoxy, silicone and polyimide.

FIG. 4 is a side view of the resin LOC package. The underlying integrated circuit die 30 can be seen to be covered at two locations with adhesive tape 20. It is also possible to employ, for example, a single strip of adhesive tape 20 to attach an integral lead frame 10 at a single point. Also shown are wire bonds 40 connecting contact pads 35 to leads 75. Elongated strips 55 which may or may not be present in a device according to this invention are also shown in FIG. 4.

Figure 5:
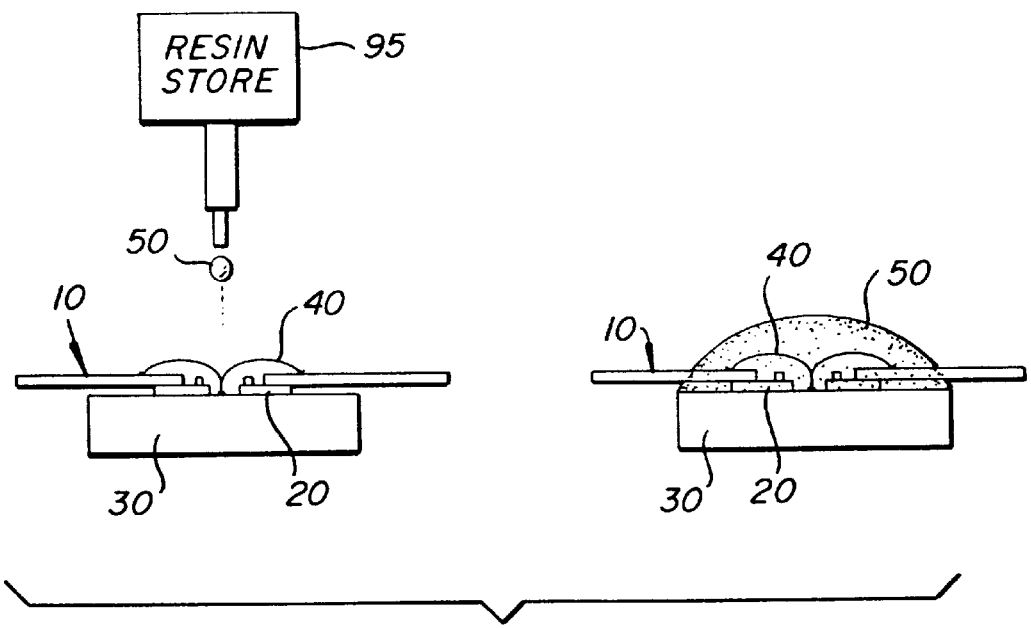
FIG. 5 illustrates one possible embodiment of an encapsulation method according to the invention.

FIG. 5 illustrates one possible embodiment of an encapsulation method according to this invention. In this resin dispensing method, a syringe-type liquid dispensing system 95 is loaded with resin material 50 which may be selectively dispensed either by an operator or through automated controls. This system provides the ability to accurately position the dispensing nozzle as well as the ability to control the volume of resin material 50 dispensed at any one time. The dispensed resin pattern can be programmed to be centered at a particular location, to be a certain depth and to extend laterally to particular dimensions depending upon chip size, lead frame configuration and the length and curvature of the wire bond 40. The viscosity of the encapsulant will affect the extent to which the die surface is wetted. The surface to be coated consists of leadframe 10, wire bonds 40 and die 30, and is thus very irregular. In the case of FIG. 5, a lower viscosity encapsulant would be used to achieve proper rheology due to the irregularity of the surface shape.

Resin material 50 may, for example, be deposited at room temperature (25 degrees centigrade) and curing may be accomplished in a range from 100 degrees centigrade to 200 degrees centigrade.

Figure 6:
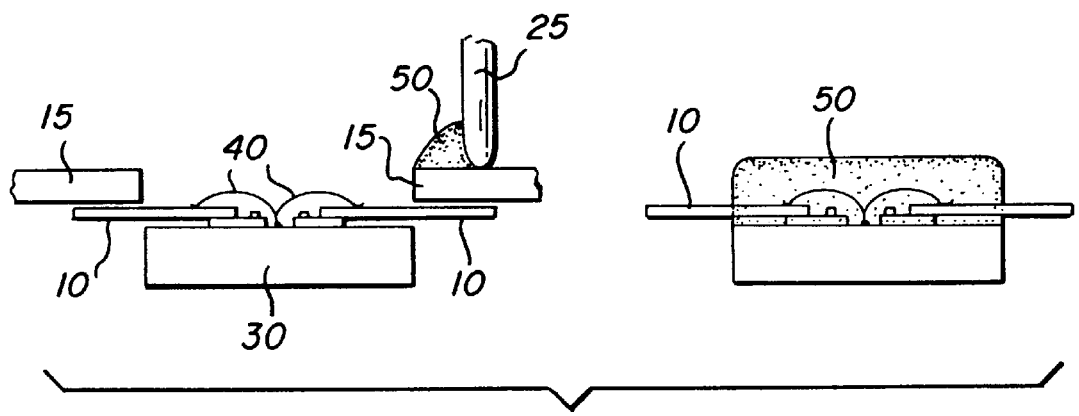
FIG. 6 illustrates a second possible embodiment of an encapsulation method according to the invention.

FIG. 6 illustrates another possible method of encapsulation according to this invention. In this screen printing method, after the die 30 is attached to the lead frame 10 and wire bonding is completed, a stencil or metal printing mask 15 with the desired top package shape is placed on top of the lead frame 10. Resin material 50 is then placed so it generally blankets the non-void area of metal printing mask 15. Following this step, one or more wipers 25 are placed in contact with the resin material 50 so that the wipers can relocate the resin material 50 into the void areas of the printing mask 15. In this method, a very high viscosity resin material 50 is used because the thickness of the resin 50 is controlled by the thickness of the stencil and thus the depth of the voids positioned for encapsulant deposition.

As will be apparent to one of ordinary skill in the art, the methods according to this invention eliminate the incomplete fill problem caused by prior art methods. Because a conventional mold is unnecessary, very thin packages may be fabricated which do not suffer from cracking and other problems associated with a situation where small voids remain in the encapsulant material.

Figure 7A:
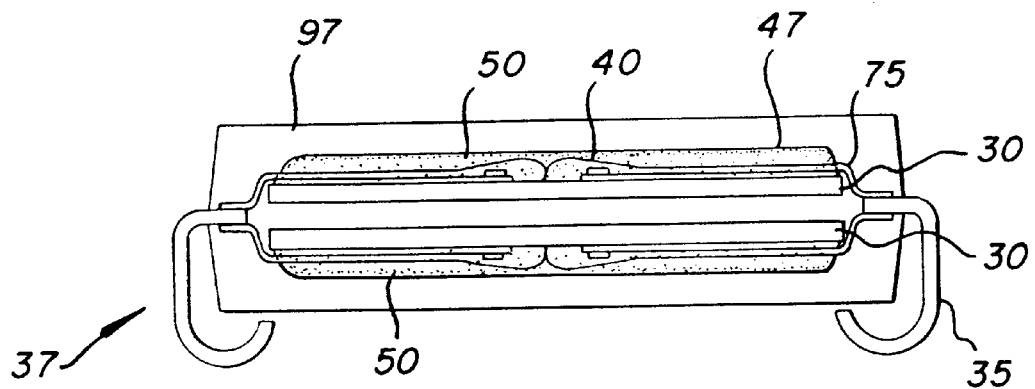
FIGS. 7A–C illustrate side views of the resin LOC package in three possible configurations.
Figure 7B:
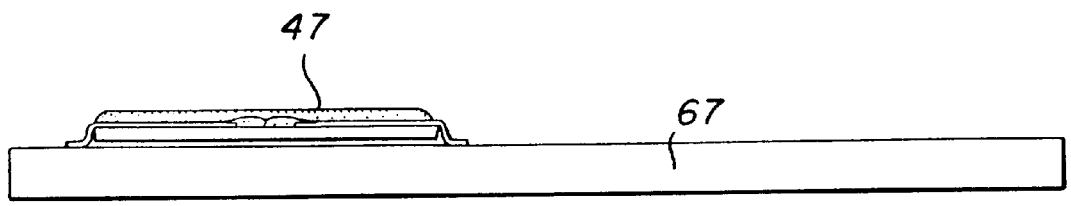
Figure 7C:
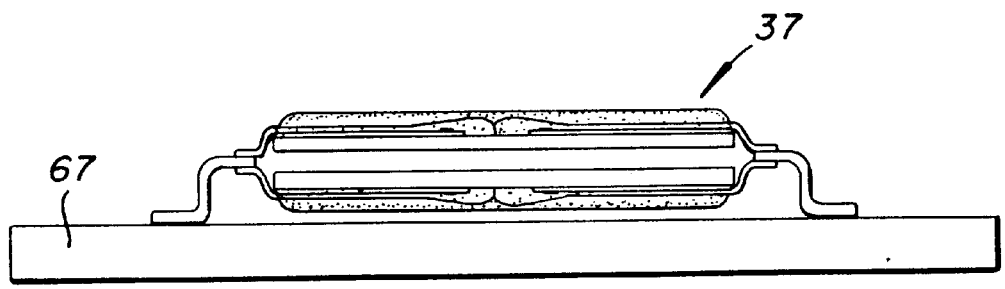

FIGS. 7a–7c illustrate some possible applications for semiconductor chips packaged according to the current invention. In FIG. 7a, a stack chip 37 (MCM) is shown wherein two encapsulated chips are placed back to back. The encapsulated chips are commonly further encapsulated in mold 97 using a transfer molding process as is common in the industry. Each one of the leads 75 on the semiconductor chips 47 are joined at a common lead 35 thus resulting in a common lead 35 for each lead 75 present on each of the semiconductor chips 47. It is also possible to employ two functionally different semiconductor chips in the same mold. Particular leads 75 may then be selected to be joined with a common lead 35 to achieve a desired functional result.

It is to be understood that by using this method of constructing the MCM, it is possible to ensure proper chip functionality prior to encapsulation in the MCM. This is especially true for memory chips which typically undergo a series of functional electrical tests.

In either MCM embodiment, common leads 35 of stack chip 37 may be directly interfaced with a printed circuit board 67. This is illustrated in FIG. 7c. FIG. 7b illustrates a single semiconductor chip 47 according to one embodiment of this invention located on printed circuit board 67.

Thus, it is apparent that there has been provided, in accordance with the present invention, a method and apparatus for packaging an integrated circuit that satisfies the advantages set forth above. Although particular embodiments have been described in detail, it should be understood that various changes, substitutions, and alterations can be made herein without departing from the scope or spirit of this invention.

What is claimed is:

1. A small form factor semiconductor chip comprising:
   a lead frame;
   at least one section of adhesive securing said lead frame to an integrated circuit die, said lead frame being positioned above said integrated circuit die;
   at least one wire bond electrically connecting at least one contact pad to said lead frame; and
   a resin encapsulant covering only one surface of the integrated circuit die.

2. The semiconductor chip of claim 1, wherein the small form factor semiconductor chip further comprises a plurality of wire bonds and a plurality of contact pads, each said wire bond electrically connecting one of said contact pads with said lead frame.

3. The semiconductor chip of claim 2, wherein said wire bonds are comprised of gold.

4. The semiconductor chip of claim 1, wherein said adhesive is double-sided adhesive tape.

5. The semiconductor chip of claim 1, wherein said resin encapsulant is silicone.

6. The semiconductor chip of claim 1, wherein said resin encapsulant is epoxy.

7. The semiconductor chip of claim 1, wherein said resin encapsulant has a thickness of from 20 Mils to 40 Mils.

8. The semiconductor chip of claim 1, wherein the small form factor semiconductor chip further comprises two sections of adhesive comprising double-sided adhesive tape.

9. The semiconductor chip of claim 2, wherein the small form factor semiconductor chip further comprises two sections of adhesive comprising double-sided adhesive tape wherein said contact pads are located along a centerline of said integrated circuit die and each one of said two sections of double-sided adhesive tape is placed on alternate sides of said contact pads.

10. The semiconductor chip of claim 1, wherein the small form factor semiconductor chip further comprises two sections of adhesive comprising double-sided adhesive tape wherein each of said two sections of double-sided adhesive tape contacts one or more leads located on said lead frame.

11. The semiconductor chip of claim 1, wherein the small form factor semiconductor chip further comprises two sections of adhesive comprising double-sided adhesive tape wherein said lead frame contains at least one elongated strip running substantially parallel to a centerline of said integrated circuit die, said at least one elongated strip being in contact with one side of each of said double-sided adhesive tape sections.

12. The semiconductor chip of claim 1, wherein said semiconductor chip is incorporated into a multichip module.

* * * * *